United States Patent
Carbo, Jr. et al.

(10) Patent No.: US 12,238,870 B2
(45) Date of Patent: Feb. 25, 2025

(54) DEPOSITION WITH SOLID FEEDSTOCK

(71) Applicant: Liquid Wire Inc., Portland, OR (US)

(72) Inventors: Jorge E. Carbo, Jr., Portland, OR (US); Trevor Antonio Rivera, Portland, OR (US)

(73) Assignee: Liquid Wire Inc., Portland, OR (US)

( * ) Notice: Subject to any disclaimer, the term of this patent is extended or adjusted under 35 U.S.C. 154(b) by 0 days.

(21) Appl. No.: 17/151,092

(22) Filed: Jan. 15, 2021

(65) Prior Publication Data

US 2021/0282270 A1    Sep. 9, 2021

Related U.S. Application Data

(60) Provisional application No. 62/961,686, filed on Jan. 15, 2020.

(51) Int. Cl.
*H05K 3/12*      (2006.01)

(52) U.S. Cl.
CPC ....... *H05K 3/12* (2013.01); *H05K 2203/0502* (2013.01)

(58) Field of Classification Search
CPC ............. H05K 3/12; H05K 2203/0502; H05K 3/1241; H05K 3/101; H05K 1/09;
(Continued)

(56) References Cited

U.S. PATENT DOCUMENTS

2014/0109782 A1    4/2014    Fergen et al.
2015/0174824 A1    6/2015    Gifford et al.
(Continued)

FOREIGN PATENT DOCUMENTS

WO    WO-2017151523 A1    9/2017
WO    WO-2021146643 A2    7/2021
WO    WO-2021146643 A3    9/2021

OTHER PUBLICATIONS

Fassler, "3D Structures of Liquid-phase GaIn Alloy Embedded in PDMS with Freeze Casting", 2013, Lab Chip, 13, p. 4442-4450 (Year: 2013).*
Merriam-Webster Dictionary, "emit", 2024, p. 1 (Year: 2024).*
Gannarapu, A., et al., "Freeze-Printing of Liquid Metal Alloys for Manufacturing of 3D, Conductive, and Flexible Networks", 2016, Adv. Mater. Technol., 1, 1600047, p. 1-8 (Year: 2016).*
"International Application Serial No. PCT/US2021/013755, International Search Report mailed Jul. 8, 2021", 5 pgs.
(Continued)

*Primary Examiner* — Katherine A Bareford
*Assistant Examiner* — Christina D McClure
(74) *Attorney, Agent, or Firm* — Quinn IP Law; David S. Nay

(57) ABSTRACT

A method may include providing a fluid material, solidifying the fluid material, providing a substrate, and depositing the solidified fluid material on the substrate. Providing the fluid material may include providing a mold, and filling the mold with the fluid material. Solidifying the fluid material may include solidifying the fluid material in a mold, and removing the solidified fluid material from the mold. Providing the substrate may include preparing the substrate for deposition of the solidified fluid material, and adjusting the temperature of the substrate. Depositing the solidified fluid material on the substrate may include fixturing the substrate, and loading the solidified fluid material in a deposition tool. The fluid material may include a liquid phase component, and a solid phase component. The solid phase component may include particles suspended in the liquid phase component. The liquid phase component may include a gallium alloy.

20 Claims, 7 Drawing Sheets

(58) Field of Classification Search
CPC ........ H05K 3/103; B33Y 70/00; B33Y 10/00; B33Y 30/00
See application file for complete search history.

(56) References Cited

U.S. PATENT DOCUMENTS

| | | |
|---|---|---|
| 2017/0367179 A1 | 12/2017 | Holbery et al. |
| 2018/0247727 A1 | 8/2018 | Ronay |
| 2019/0056277 A1 | 2/2019 | Ronay |
| 2020/0066628 A1 | 2/2020 | Ronay et al. |
| 2020/0221580 A1 | 7/2020 | Tavakoli et al. |
| 2021/0045251 A1 | 2/2021 | Ma et al. |
| 2021/0053815 A1 | 2/2021 | Feng et al. |
| 2022/0088712 A1* | 3/2022 | Nakano .................. B33Y 30/00 |

OTHER PUBLICATIONS

"International Application Serial No. PCT/US2021/013755, Invitation to Pay Additional Fees mailed Apr. 27, 2021", 2 pgs.

"International Application Serial No. PCT/US2021/013755, Written Opinion mailed Jul. 8, 2021", 7 pgs.

Liu, Shuiren, et al., "A general gelation strategy for ID nanowires: dynamically stable functional gels for 3D printing flexible electronics", Nanoscale, 10, (2018), 20096-20107.

"European Application Serial No. 21741397.0, Response to Communication pursuant to Rules 161 and 162 filed Feb. 24, 2023", 7 pgs.

"International Application Serial No. PCT/US2021/013755, International Preliminary Report on Patentability mailed Jul. 28, 2022", 9 pgs.

* cited by examiner

DEPOSITION WITH SOLID FEEDSTOCK

CROSS-REFERENCE TO RELATED APPLICATION

This application claims priority from U.S. Provisional Patent Application Ser. No. 62/961,686 filed Jan. 15, 2020 which is incorporated by reference.

BACKGROUND

The inventive principles of this patent disclosure relate generally to deposition of materials on substrates, and more specifically to deposition with solid feedstock.

SUMMARY

A method may include providing a fluid material, solidifying the fluid material, providing a substrate, and depositing the solidified fluid material on the substrate. Providing the fluid material may include providing a mold, and filling the mold with the fluid material. Solidifying the fluid material may include solidifying the fluid material in a mold, and removing the solidified fluid material from the mold. Providing the substrate may include preparing the substrate for deposition of the solidified fluid material, and adjusting the temperature of the substrate, Depositing the solidified fluid material on the substrate may include fixturing the substrate, and loading the solidified fluid material in a deposition tool. The fluid material may include a liquid phase component, and a solid phase component. The solid phase component may include particles suspended in the liquid phase component. The liquid phase component may include a gallium alloy. The solid phase component may include gallium oxide. The gallium oxide may include gallium oxide particles. The gallium oxide may include a network of gallium oxide structures. The network of gallium oxide structures may include interlinked gallium oxide structures. The fluid material may include a conductive gel. The fluid material may include a non-Newtonian material. The deposited solidified fluid material forms a pattern of traces on the substrate.

An apparatus may include a base configured to fixture a substrate, and a feed head configured to feed a solidified fluid feedstock to the substrate at a deposition site, wherein the base and the feed head are configured to move the deposition site on the substrate, the feedstock has a width, and the feed head is configured to reduce the width of the feedstock as it is fed to the substrate. The feedstock may form a pattern of traces on the substrate.

A method may include feeding a deformable conductive material in a solid form to a deposition site on a substrate, depositing the deformable conductive material on the substrate at the deposition site, and converting at least a portion of the deformable conductive material to a non-solid form. The method may further include moving the deposition site to form a pattern of the deformable conductive material on the substrate.

BRIEF DESCRIPTION OF THE DRAWINGS

The figures are not necessarily drawn to scale and elements of similar structures or functions may generally be represented by like reference numerals or portions thereof for illustrative purposes throughout the figures. The figures are only intended to facilitate the description of the various embodiments described herein. The figures do not describe every aspect of the teachings disclosed herein and do not limit the scope of the claims. To prevent the drawings from becoming obscured, not all of the components, connections, and the like may be shown, and not all of the components may have reference numbers. However, patterns of component configurations may be readily apparent from the drawings.

DETAILED DESCRIPTION

Some of the inventive principles of this disclosure relate to methods for depositing materials that may be fluid at a temperature of use and/or fabrication onto a substrate, as well as deposition apparatus to enable such deposition. In some embodiments, the apparatus may incorporate computer numerical control (CNC) technology for use with such methods, materials and/or apparatus.

In some embodiments, a temperature of use and/or fabrication may be at or about room temperature which may be approximately 20 degrees Celsius, and may generally be within the range of 18 to 22 degrees Celsius, 10 to 30 degrees Celsius and/or any other suitable range.

In some embodiments, a "Fluid" material may have particles that easily move and change their relative position and that yield to pressure, i.e., are capable of flowing. Specific examples include but are not limited to liquids, pastes, foams and non-Newtonian materials such as gels and Bingham plastics.

In some embodiments, a fluid material may include a deformable conductor made from a gallium alloy and may be deposited as a circuit trace onto a resilient substrate, One example may be a conductive gel which may be referred to by the trade name Metal Gel, some examples of which are disclosed in International Patent Application PCT/US2017/019762 filed Feb. 27, 2017 which is incorporated by reference and was published on Sep. 8, 2017 as International Publication No. WO 2017/151523 A1 which is also incorporated by reference, and U.S. patent application Ser. No. 15/947,744 filed Apr. 6, 2018 which is incorporated by reference and was published as US Patent Application Publication No. 2018/0247727 on Aug. 30, 2018 which is also incorporated by reference.

Other suitable fluid materials may include conductive or electroactive materials formed from conductive metals including gold, nickel, silver, platinum, copper, etc.; semiconductors based on silicon, gallium, germanium, antimony, arsenic, boron, carbon, selenium, sulfur, tellurium, etc., semiconducting compounds including gallium arsenide, indium antimonids, and oxides of many metals; organic semiconductors; and conductive nonmetallic substances such as graphite. Examples of suitable non-electroactive compositions include many other types of gels such as, for example, silica gels, and chafing fuel such as Sterno, etc.

In some embodiments, the inventive principles herein may be realized with materials that have at least a partial composition, structure or behavior that is non-solid at room temperature or other ambient temperature for use and/or fabrication.

Figure 1:
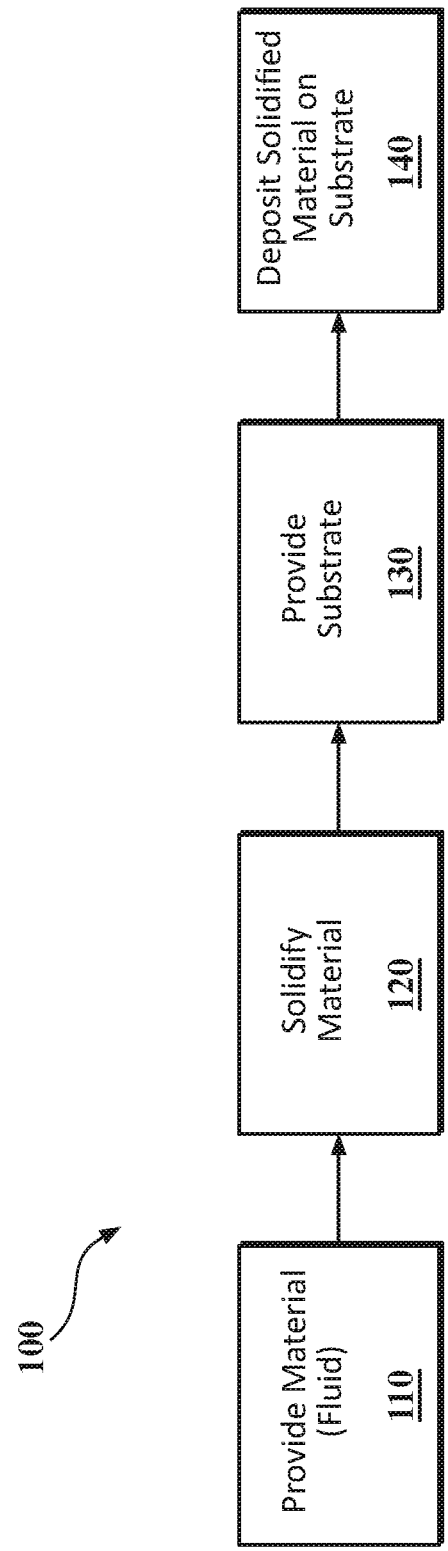
FIG. 1 is a flow diagram illustrating an example embodiment of a method according to this disclosure.

FIG. 1 is a flow diagram illustrating an example embodiment of a method according to this disclosure. The method 100 illustrated in FIG. 1 may for used, for example, for depositing a material such as one of those disclosed herein onto a substrate. The method may begin at step 110, which may include providing a material that may be fluid at the ambient temperature of the surrounding environment. In this example, the environment may be a manufacturing facility that is kept at room temperature. In the second step 120, the material may be solidified, e.g., by placing the material in a second environment where the temperature is controlled at or below the freezing or solidification point of the material. In a third step 130, a substrate material may be provided that a user of the method 100 may wish to deposit the fluid material onto. In a fourth step 140, the solidified material of the second step 120 may be deposited onto the substrate material provided in the third step 130.

In some embodiments, the deposited material may form a pattern of traces on the substrate. In some embodiments, a pattern of traces may refer to a single trace or portion thereof.

Figure 2:
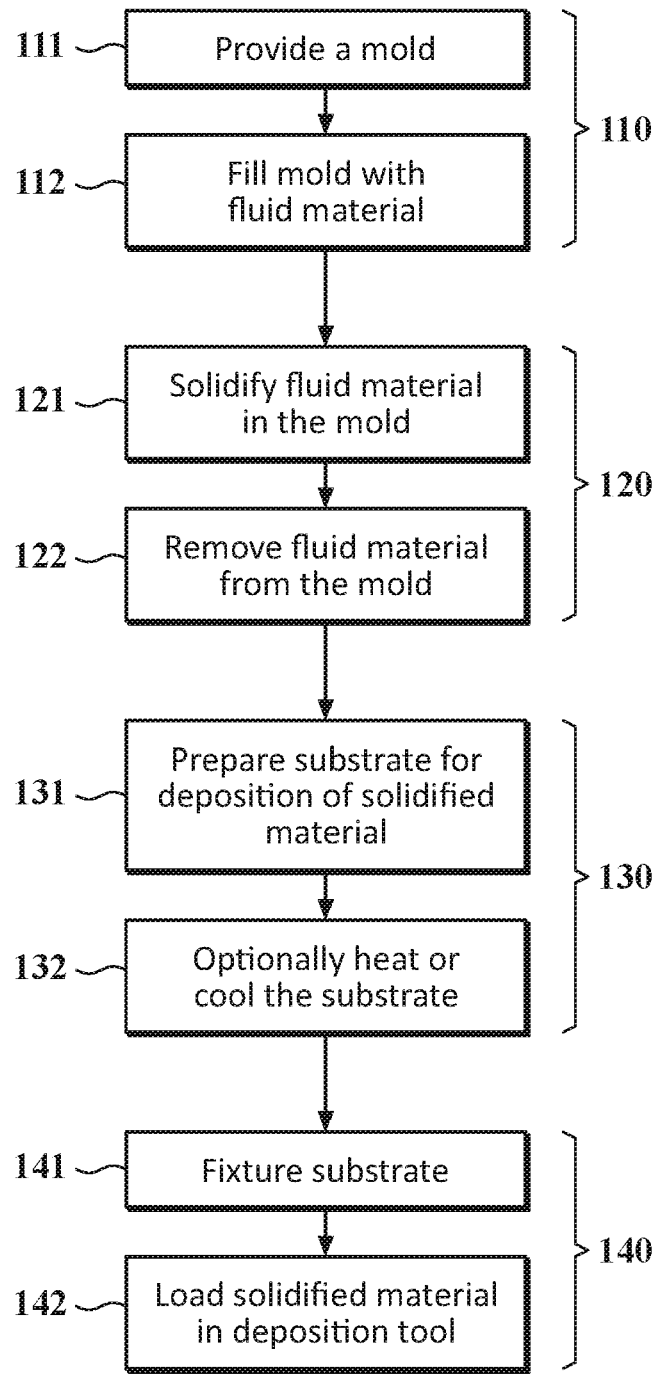
FIG. 2 is a flow diagram illustrating another example embodiment of a method according to this disclosure.

FIG. 2 is a flow diagram illustrating another example embodiment of a method according to this disclosure. The embodiment illustrated in FIG. 2 may include additional steps that may be useful for handling the fluid material in more complex embodiments of the method 100. The first step 110 optionally includes sub steps 111, 112 of providing a mold and filling the mold with the material, respectively. Second step 120 may optionally include the sub steps 121, 122 of solidifying the material within the mold and removing the solidified material from the mold, respectively. Third step 130 may optionally include the sub step 131 of preparing the substrate for the fourth step 140. For example, deposition may be more successful if the surface of the substrate is cleaned and/or modified in some manner. By way of example, the substrate material may be texturized, e.g., by media blasting, molding, etching, or other processes. In other examples, the substrate may be primed or coated with another material to enhance adhesion of the solidified material, and/or the surface of the substrate may be softened or hardened, e.g., via chemical or thermal treatments such as tempering. In yet another example, the substrate may be subjected to a process to alter its surface energy, e.g., via a corona or plasma discharge treatment. Additionally and optionally, the third step 130 may include the substep 132 of heating or cooling the substrate material to a desired temperature. The fourth step 140 may optionally include the substeps 141, 142 of fixturing the substrate and of loading the solidified material into a tool for controlling deposition parameters, respectively, By way of example, deposition may be performed by ablating the solidified material onto the substrate utilizing pressure and relative motion between the two materials. In such an example, the parameters that may be beneficial to control are the pressure and the rate of relative motion.

The above method 100 may be performed using a variety of techniques and principles depending on the specific pairing of solidified material and substrate material.

In some embodiments, a material may be considered to be in a solid form if it s fully or partially solidified or frozen to an extent that it may be handled as a solid. In some embodiments, a material may be considered to be in a solid form if it is capable of being handled without being in a container.

For purposes of illustration, some example, embodiments of methods and apparatus may be described in the context of a fluid material that is implemented as a gel, but the inventive principles are not limited to uses with gels and may applied to any other fluid materials.

In some example embodiments, the fluid material may be a conductive gel that is formed into a rod or wire shape and fully or partially solidified or frozen to an extent that the rod may be handled as a solid. The rod or wire may be fed to a deposition site on a substrate where gel from the rod may be deposited on the substrate. The site may move along the substrate, for example, to form a pattern of conductive gel on the substrate. The rod or wire may be fed to the site through a feed tube, an arrangement of rollers, a mechanical clamp, claw, chuck, etc., or any other suitable mechanism that may feed the rod or wire to the deposition site as material from the rod is transferred to the substrate.

In some embodiments, the rod or wire of fully or partially frozen conductive gel may be fully or at least partially liquified or melted at the deposition site by heat created by contact between the rod or wire and the substrate. The contact heat may be caused by pressure between the rod or wire and the substrate, for example, if the rod or wire contacts the surface of the substrate with a force that is at least partially normal to the substrate. The contact heat may also be caused by friction or other interaction with the surface of the substrate, for example, if the rod or wire is dragged, pushed, pulled, or otherwise moved along the surface of the substrate while in contact with the substrate. In different embodiments, contact heat may be cause by any, or a combination of any, of these and/or other mechanisms that may produce contact heat.

In some embodiments, the rod or wire of fully or partially frozen conductive gel may be fully or at least partially liquified or melted at or near the deposition site by heat conducted to the gel through, for example, a heated nozzle or feed tube, ring, or other thermally conductive mechanical contact that may contact the rod or wire at or near the deposition site.

In some embodiments, the rod or wire of fully or partially frozen conductive gel may be fully or at least partially liquified or melted at the deposition site by heat transfer through the bulk flow of matter (e.g., convection, advection, diffusion, etc.) such as the flow of a fluid such as gas or liquid or other matter at or near the deposition site. Examples include a jet of heated air or other gas, heated water or other liquid, etc.

In some embodiments, the rod or wire of fully or partially frozen conductive gel may be fully or at least partially liquified or melted at the deposition site by heat from a radiant source such as an infrared (IR), ultrasound (U/S), radio frequency (RE) and/or laser heat source, etc.

Other possible sources of heat to fully or at least partially liquify or melt a conductive gel include electric heating such as resistance heating caused by an electric current flowing through the gel and/or the substrate. For example, an electric current may be made to flow through the rod or wire of fully or partially frozen conductive gel between two contacts located on opposite sides of the rod or wire, or at two different locations along the length of the rod or wire. Alternatively, an electric current may flow between one contact on the rod or wire and another contact that touches the substrate if the substrate is electrically conductive, or a contact that touches previously deposited conductive gel on the substrate. As another example, heat may be generated by an electric discharge between the rod or wire of conductive gel and a nearby electrode and/or between the rod or wire and the substrate and/or between two electrodes located near the deposition site. In some embodiments, electric contacts may be integral with one or more clamps, claws, or other mechanical apparatus that hold, feed, roll or otherwise interact with the fully or partially frozen conductive gel.

In some embodiments, all or some of the heat to fully or partially liquify or melt the fully or partially solidified or frozen conductive gel may be provided through the substrate, for example, by preheating the substrate prior to deposition, and/or by spot heating the substrate at the point of deposition and at the time of deposition using and suitable heating technique including any of those described above for heating the conductive gel.

In different embodiments, the size of the size of feedstock may be larger, smaller or the same size as, some of the features to be deposited on the substrate. In some embodiments, the rod, wire, or other shape of fully or partially solidified or frozen conductive gel may be sharpened or otherwise tapered or modified in shape, for example, to enable deposition of features that are smaller or more precise than may otherwise be achieved with the rod, wire or other shape of feedstock.

Any heating techniques, including the ones described above may be used in combination, for example, by apply heat to a rod or wire of fully or partially frozen conductive gel almost to liquification or melting before contact with the substrate, and then heat from the substrate, or other source may provide additional heat to fully or more partially liquify or melt the gel.

In some embodiments, the fully or partially frozen conductive gel may be deposited on the substrate at least partially in solid form, then be at least partially liquified or melted after deposition by any suitable source of heat.

In some embodiments, a rod or wire of fully or partially frozen conductive gel may be shaped to form a nib, for example, by cutting with one or more straight or spiral blades like a pencil sharpener, by contact with an abrasive or cutting surface such as sandpaper, a micro plane, etc. The abrasive or cutting surface may be formed into a trough or V-shape through which the end of the rod or wire may be pulled to form a point.

In addition to a rod or wire shape, a conductive gel or other deformable conductive material may be formed into any other suitable shape and fully or partially frozen to an extent that it may be handled as a solid. Examples include sheets, tubes, granules, pellets, and/or extrusions of any cross-section, etc.

In some embodiments, there may not be any actual contact between the fully or partially solidified or frozen feedstock. For example, the feedstock may be fully or least partially liquified or melted prior to contact, for example, by forming droplets which may then be transferred to the substrate through electrostatic or other propulsive forces.

Although some embodiments have been described in which the feedstock may be fully or partially solidified and then fully or at least partially liquified through thermal processes, in other embodiments, the feedstock may be fully or partially solidified and then fully or at least partially liquified through chemical or other processes, for example through application of one or more solidifying and/or liquifying agents.

In any of the above examples, the substrate material may be a polymer sheet or film, e.g., a thermoplastic polyurethane (TPU) or another thermoplastic or thermoset polymer. In other examples, the substrate may be a thermoset or thermoplastic film or sheet that is partially cured, e.g., a B-stage epoxy resin film. The substrate may be pliable and/or stretchable, resilient, or otherwise possess an elastic property, or conversely the substrate may be rigid and/or hard or stiff. The substrate may further exhibit a wide range of tackiness from little to no tack, or a high degree of tack so as to exhibit an adhesive property.

A wide variety of apparatuses may be configured to the achieve the above methods with the contemplated fluid and substrate materials. For purposes of illustrating some of the inventive principles, some example embodiments of apparatuses may be described below with respect to specific implementation details such as CNC machinery, temperature ranges, dimensions, tolerances, and/or the like, but the inventive principles are not limited to these example details.

Figure 3:
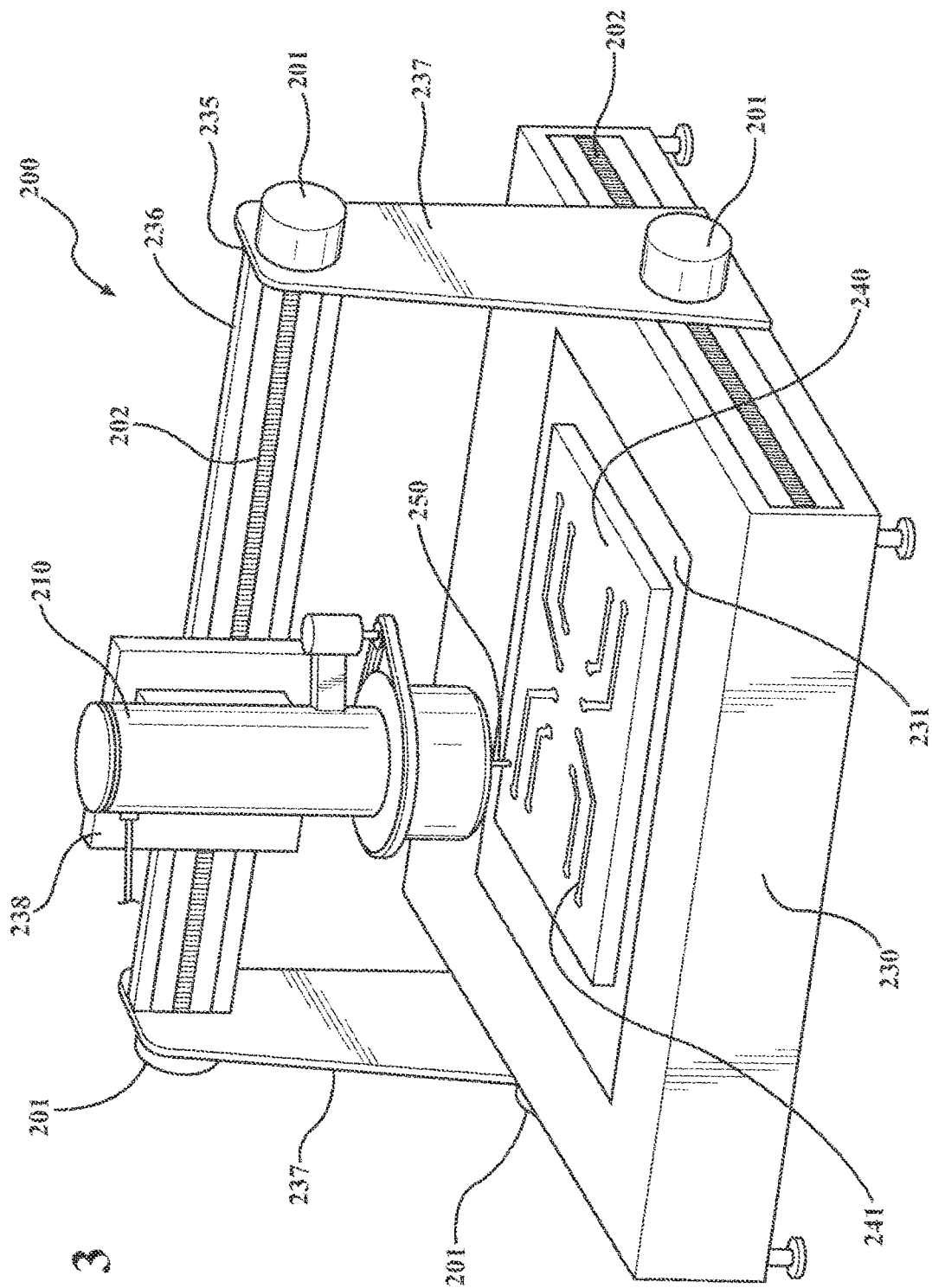
FIG. 3 is a perspective view illustrating an example embodiment of a deposition machine or apparatus according to this disclosure.
Figure 7:
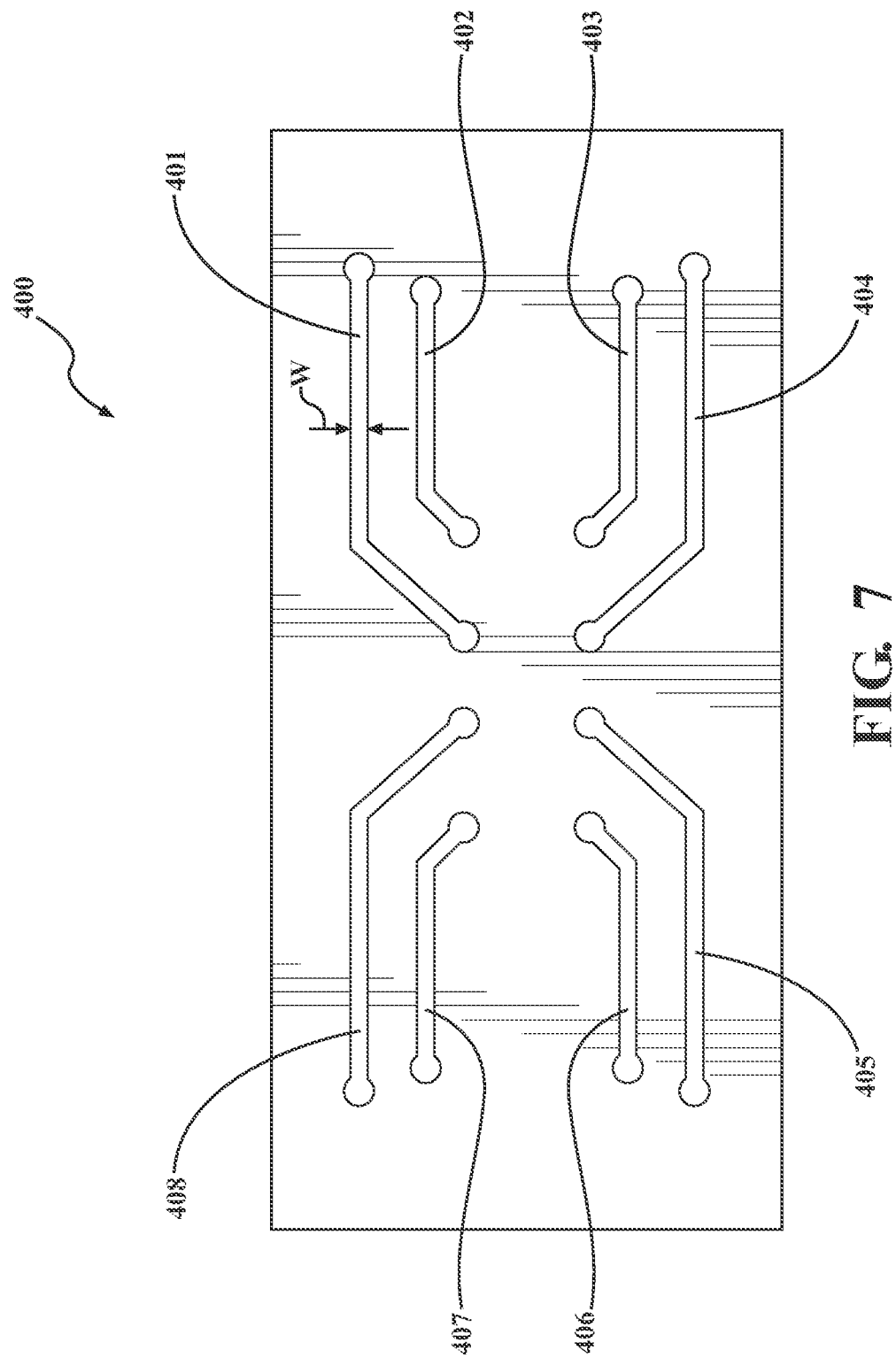
FIG. 7 is a plan view of an article of manufacture fabricated using the embodiments of apparatuses and methods described herein.

FIG. 3 illustrates an example CNC deposition machine or apparatus 200 operable to fixture a substrate 240 and deposit a solidified fluid material 250, which may also be referred to as the feedstock 250. The CNC deposition machine 200 may generally include a feed head 210, a base 230, and a gantry 235. The base 230 and gantry 235 may form a multi-axis frame to support and move the feed head 210 relative to a substrate 240 (e.g., a printed circuit 400 as seen in FIG. 7). The multi-axis frame's axis motors 201 and the feed head 210 may be controlled using signals from a computer communicatively coupled to the CNC deposition machine 200, e.g., via a data and power cable (not shown), a wireless communication protocol, and/or the like. Depending on the need, the CNC deposition machine 200 may have a large or small form factor and may provide movement of the feed head 210 and/or substrate 240 along two to six axes. For example, in some embodiments, the CNC deposition machine 200 may be any size between 1 to 20 feet on a side (i.e., the X-, Y-, and Z-axis), depending on the intended application. A CNC deposition machine 200 with a small form factor such as for desktop use (i.e., 3 feet or less on a side) may, for example, have a range of motion of 10 to 25 inches on the Z-axis, 15 to 36 inches on the X-axis, and 15 to 36 inches on the Y-axis.

The multi-axis frame may selectively move the feed head 210 relative to the substrate 240 (which is positioned on a work surface 231 of the base 230) along one or more of the X-, Y-, and Z-axes (i.e., three actuated degrees of freedom) under computer (i.e., processor) control. In other implementations, the CNC deposition machine 200 may incorporate additional actuated degrees of freedom in addition to the X-, Y-, and Z-axes, up to six or more actuated degrees of freedom. In some embodiments, an axis may refer to a linear axis, a rotational axis, or any other configuration of motion.

The multi-axis frame may employ a plurality of axis motors 201 (e.g., stepper motors) and linear couplings 202 (e.g., linear rails, tracks, rods, screws, feeds, etc.) to move the feed head 210 along each actuated degree of freedom within its operating envelop. For example, one or more axis motors 201 and linear couplings 202 may be provided to selectively control each axis of freedom. By way of example, the axis motor(s) 201 may provide a resolution of 0.001 inch or greater on each axis to achieve a dimensional accuracy better than +−0.0.005 inch.

In one example, the multi-axis frame's gantry 235 may include a linear cross-member 236 coupled to and supported by the base 230 via a set of parallel vertical support members 237. As illustrated, the linear cross-member 236 is coupled at each end to a vertical support member 237 perpendicularly (i.e. at an angle of 90 degrees) such that the longitudinal axis of the linear cross-member 236 is substantially parallel to the work surface 231 (i.e., the top plane or surface) of the base 230. The feed head 210 may be coupled to a mounting plate 238 such that the drive motor can move relative to the base 230 along the Z-axis (i.e., up and down). For example, the feed head 210 (or an intermediate motor structure coupled to the feed head 210) may be slidably coupled to a mounting plate 238 via a first set of linear couplings and controlled via a first axis motor. In another example, the feed head 210 may be fixed relative to the mounting plate 238, where no movement along the Z-axis is provided for feed head 210. Such Z-axis translation may not be necessary since feed head 210 may be capable of controlling the Z-location of the feedstock 250 relative to substrate 240, which may be sufficient for deposition.

The mounting plate 238, in turn, may be coupled to the linear cross-member 236 and configured to travel relative to the base 230 along the X-axis via a second set of linear couplings 202 under the power of a second axis motor 201. To provide movement along the Y-axis, each vertical support member 237 may be slidably coupled to the base 230 via a third set of linear couplings 202 such that it moves relative to the base 230 under the power of a third axis motor, which may be positioned on the vertical support members 237 (as illustrated) or within the base 230. Displacing the set of vertical support members 237 along the Y-axis may also displace the linear cross-member 236 and devices coupled thereto.

The structural components of the multi-axis frame, e.g., gantry 235 and base 230 and their subcomponents may be fabricated using a high strength and/or rigid components which may be fabricated using a variety of processes and techniques. Suitable metals include, for example, aluminum, magnesium, steel, titanium, iron, and alloys thereof. Suitable non-metallic materials include plastics (reinforced or unreinforced), e.g., structural polymers including nylons, polypropylene, polystyrene, fluoropolymers, and epoxies.

Figure 4:
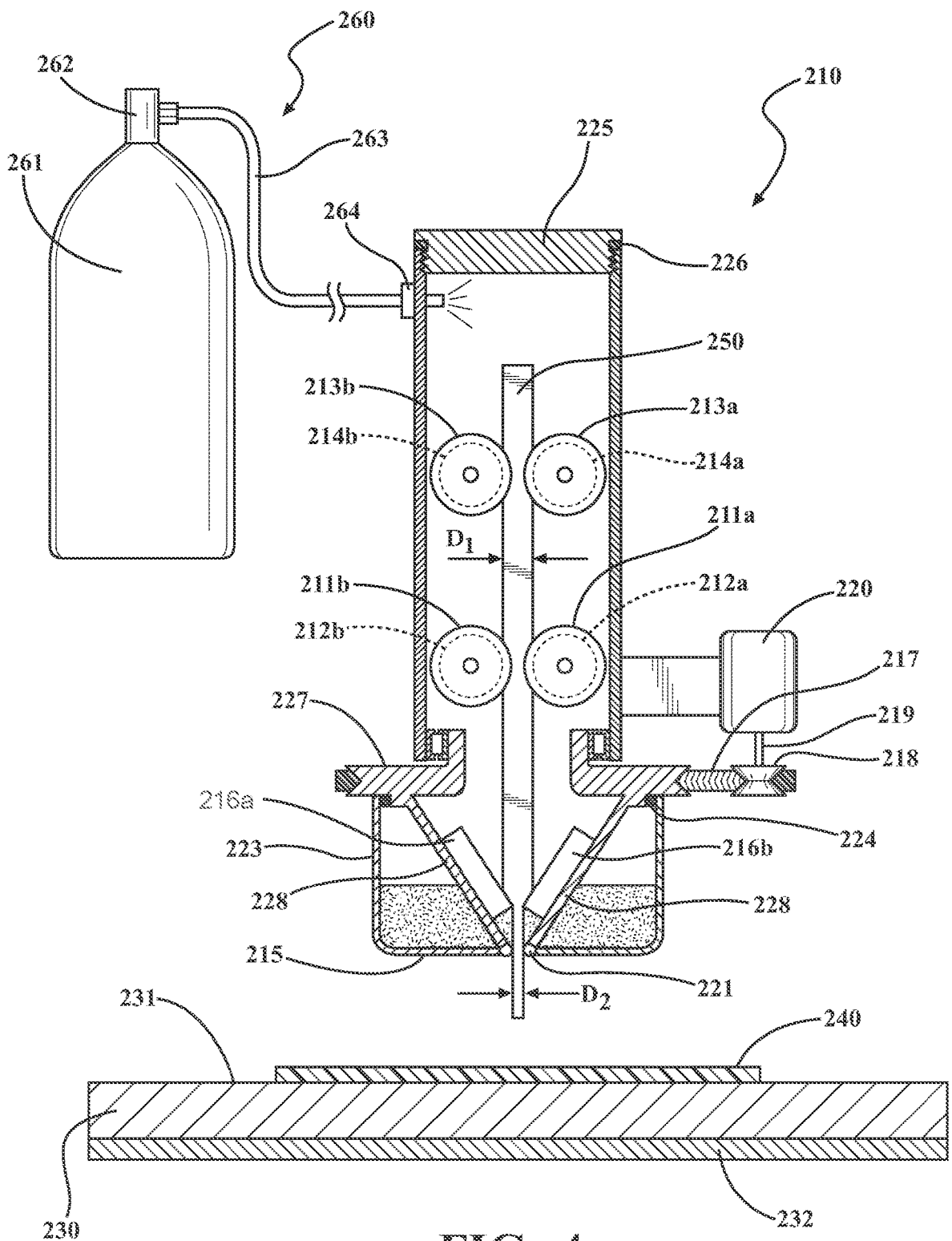
FIG. 4 is cross-sectional view illustrating some example internal details of the deposition machine or apparatus illustrate in FIG. 3 according to this disclosure.

With reference to FIGS. 3 and 4, the feed head 210 may include a drive motor (not shown) to rotate at least two feed wheels 211a, 211b adapted to receive the solidified material 250 which may be pre-formed into feedstock format having a projected width, e.g., $D_1$ and loaded into the feed head, as shown here via removable lid 225 optionally including a gasket 226. The feed wheels 211a, 211b may have complementary circumferential grooves 212a, 212b that receive the external geometry of the solidified material 250 to advance the feedstock through the feed head 210. Optionally, at least two guide wheels 213a, 213b may be provided to further stabilize the feedstock 250, for example, when the feedstock is oblong and subjected to shear forces during the deposition process, or for other reasons. Guide wheels 213a, 213b may have complementary grooves 214a, 214b similar to or identical to the grooves 212a, 212b provided in the feed wheels 211a, 211b.

With reference to FIG. 4, in operation, the feed wheels and optional guide wheels may rotate to advance the feedstock 250 within the head 210 towards the substrate 240 at a feed rate that may be dictated by the deposition method and factors such as desired pressure or force applied between the feedstock and substrate and the relative translation speed (e.g., in the X and/or Y direction) between the two. Feed rates may vary, for example, from 0.01 mm/s up to about 5 mm/s for translation speeds of between 1 mm/s up to 100 mm/s. As the feedstock 250 is advanced it may pass through a rotatable nose 215. The nose 215 may comprise a material removal system, shown by way of example as at least one blade(s) 216a, 216b optionally coupled to at least one blade support 228 that may be angled relative to feed direction and rotate synchronously with the nose 215 by operation of a drive system, e.g., nose pulley 227 driven by a belt 217 and drive pulley 218 attached to a shaft 219 of a motor 220 coupled to the feed head 210 Blades 216a, 216b may thereby remove material from the feedstock 250 to reduce its initial width to a desired output diameter, $D_2$. Prior to exiting the envelope of the nose 215, the feedstock 250 may pass through a seal 221 which may be made from a resilient material. Seal 221 may ensure that removed feedstock material 250 does not deposit onto the substrate 240 and remains within the envelope of the nose 215 which may be configured with adequate volume for removed material to accumulate. The volume may be bounded by a removable catch basin 223 configured to be easily removable, e.g., using a resilient o-ring 224 having an interference fit, magnets (not shown), a threaded coupling system (not shown), or the like.

Internal components of the feed head 210 may be made from materials having low thermal conductivity so as to not melt the feedstock 250 during operation, and/or as shown in this example may cooled by, e.g., liquified nitrogen (LN2) injection into the internal volume of the feed head. In this example, a liquified nitrogen injection system 260 may include a storage device such as a tank 261, a regulator 262, a hose 263, and an injector 264 in communication with the internal volume of the feed head 210. LN2 may be injected at a rate sufficient to maintain the feedstock 250 contacting components at or below the solidification temperature of the feedstock.

In one example, the feed head 210 may translate over the substrate 240, feedstock 250 is, e.g., fed at a rate sufficient to maintain continuous contact with the substrate. Feedstock 250 may thereby be deposited to the substrate via several mechanisms. For example, if substrate 240 and feedstock 250 have similar temperatures, the feedstock material may undergo ablative deposition onto the substrate. In another example, if the substrate 240 has a temperature at or above the melting point of the feedstock 250, the feedstock may undergo a phase change at the interface between the substrate and feedstock tip, thereby depositing to the substrate via a combination of ablation and wetting.

As such, the base 230 may be provided with at least one thermal management device 232. The device 232 may provide cooling or heating of the work surface 231 to achieve the desired deposition mechanism. Some examples are Peltier devices that provide both cooling and heating capabilities in one unit, or separate commonly known heating and cooling systems such as thermoelectric heaters, liquid heating systems, LN2 cooling systems, refrigerant based cooling systems, and the like.

Regardless of the deposition mechanism, the result may be at least one trace 241 on substrate 240 having a width W substantially similar to the diameter $D_2$ of the feedstock. $D_2$ may be selected to achieve the needed characteristics for the intended use of the deposited trace 241 (see FIG. 3). Blades 216a, 216b may be translated laterally (perpendicular to the feed direction) or normal to their relative angle from the feed direction to yield the selected $D_2$ value.

Figure 5:
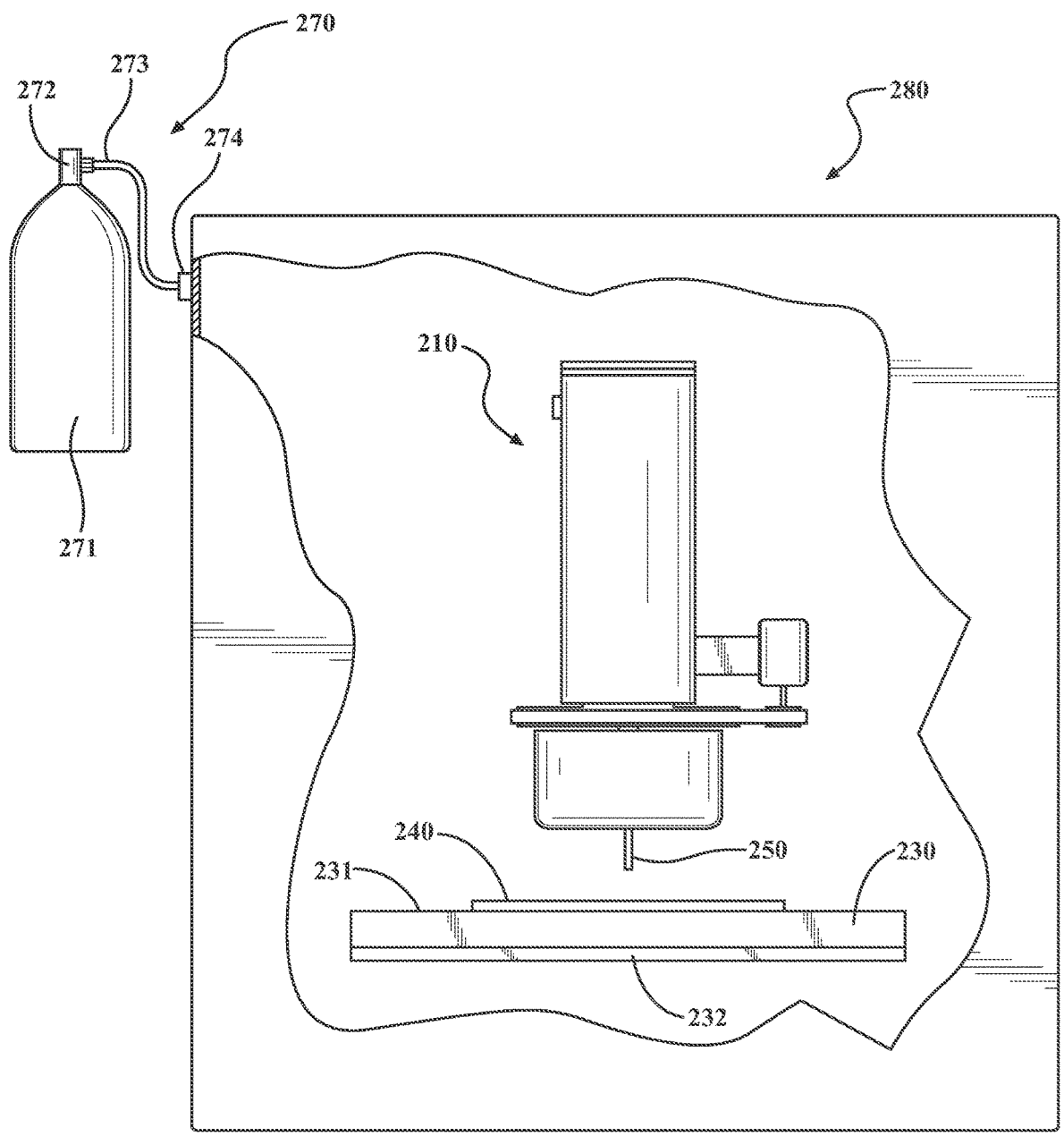
FIG. 5 is a partial cutaway view illustrating an alternative embodiment of a deposition machine or apparatus according to this disclosure.

FIG. 5 shows an alternative embodiment of the apparatus of FIGS. 3 and 4, whereby instead of internally cooling the components of feed head 210, apparatus 200 may be contained within a temperature controlled chamber 280. Chamber 280 may be cooled utilizing a system 270 similar to the system 260 utilized to cool internal components of the feed head 210, e.g., a tank 271 of LN2, a regulator 272, a hose 273, and an injector 274. Whereas the embodiment of FIGS. 3 and 4 may inject the LN2 into the feed head 210 directly, the instant embodiment may inject LN2 into the internal volume 281 of chamber 280 at a rate sufficient to maintain the feedstock 250 contacting components of the apparatus at or below the solidification temperature of the feedstock.

Figure 6:
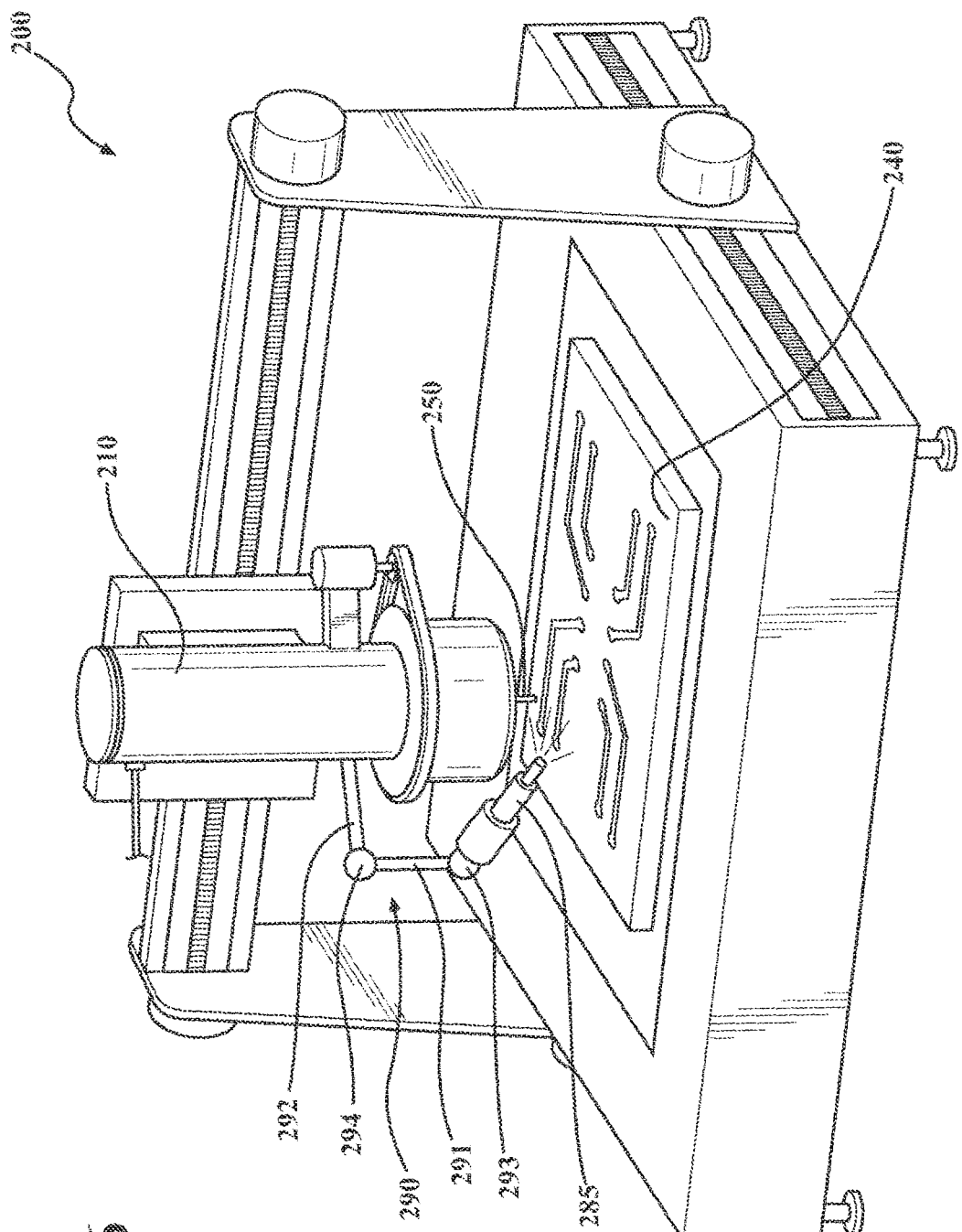
FIG. 6 is a perspective view illustrating another example embodiment of a deposition machine or apparatus according to this disclosure.

FIG. 6 shows yet another example of an apparatus similar to the one described in FIGS. 3 and 4, utilizing similar components and operation principles. In this example, an ejection nozzle 285 is shown, coupled to the feed head 210 by an arm 290. Arm 290 may include multiple segments 291, 292 and may have spherical joints 293, 294 connecting the segments to one another, and to connect the nozzle 285. Nozzle 285 may eject hot air to assist in melting feedstock 250, and/or it may eject LN2 to assist is maintaining feedstock at or below the solidification temperature of the feedstock, or for a variety of different effects it may eject any fluid or flowable medium as needed. As another example, the nozzle may eject a chemical agent that may liquify at least a portion of the feedstock. Nozzle 285 and arm 290 may further be reconfigurable and/or repositionable to direct ejected fluids at different elements of the apparatus 200 or, e.g., at the substrate 240 and any of its elements.

FIG. 7 shows the printed circuit 400 in plan view, using the apparatuses and methods described above to form traces 401, 402, 403, 404, 405, 406, 407, 408 from the solidified fluid material such as a conductive metal gel described above as the feedstock 250. It may be advantageous that the resulting traces on circuits have a width W between about 80 microns (0.08 mm) and about 2000 microns (2 mm). Thus, the apparatus 200 may be configured in this example to yield a second diameter $D_2$ of between approximately 80 microns and 2000 microns. A variety of diameters $D_1$ and $D_2$ and corresponding trace widths W may be possible utilizing the aforementioned principles and their derivatives or equivalents.

In some embodiments, where at least some of the transfer of solidified material 250 to a substrate 240 is the result of an ablative technique, a load of up to 10N may be sufficient to produce a viable trace from metal gel alloys on a variety of polymer substrates. The minimum force required to achieve functionally viable deposition may vary widely depending on factors such as the temperature of the substrate 240 and the feedstock 250. When the substrate is provided at, or brought up to, a temperature substantially greater than the solidification temperature of the feedstock, and the feedstock below but close to its solidification temperature, the required force may be negligible or substantially 0N, as melting may occur nearly instantaneously with contact between the two materials. Thus, in some example embodiments, apparatus 200 may be configured to provide a 0-10N of force between the solidified material 250 and the substrate 240.

The inventive principles contained herein may be realized with any materials that have at least a partial composition, structure or behavior that is non-solid and then feeding the material to the deposition process in a form that is more solid, or solid like, than the deposited form.

Through the addition of additional components, the above apparatuses may be modified to correspondingly alter the deposition mechanism of feedstock 250 onto substrate 240 as discussed above. The apparatuses are merely examples operable to perform the novel deposition method(s) for the types of materials described herein.

Some additional example embodiments are set forth in the following numbered clauses.

1. A method comprising: providing a fluid material; solidifying the fluid material; providing a substrate; and depositing the solidified fluid material on the substrate.
2. The method of clause 1 wherein providing the fluid material comprises: providing a mold; and filling the mold with the fluid material.
3. The method of clause 1 wherein solidifying the fluid material comprises: solidifying the fluid material in a mold; and removing the solidified fluid material from the mold.
4. The method of clause 1 wherein providing the substrate comprise: preparing the substrate for deposition of the solidified fluid material; and adjusting the temperature of the substrate.
5. The method of clause 1 wherein depositing the solidified fluid material on the substrate comprises: fixturing the substrate; and loading the solidified fluid material in a deposition tool.
6. The method of clause 1 wherein the fluid material comprises: a liquid phase component; and a solid phase component.
7. The method of clause 6 wherein the solid phase component comprises particles suspended in the liquid phase component.
8. The method of clause 6 wherein the liquid phase component comprises a gallium alloy.
9. The method of clause 8 wherein the solid phase component comprises gallium oxide.
10. The method of clause 9 wherein the gallium oxide comprises gallium oxide particles.
11. The method of clause 9 wherein the gallium oxide comprises polymerized gallium oxide structures.
12, The method of clause 9 wherein the gallium oxide comprises a network of gallium oxide structures.
13. The method of clause 12 wherein the network of gallium oxide structures comprises interlinked gallium oxide structures.
14. The method of clause 1 wherein the fluid material comprises a gel.
15, The method of clause 1 wherein the fluid material comprises a conductive gel.
16. The method of clause 1 wherein the fluid material comprises a non-Newtonian material.
17. The method of clause 1 wherein the deposited solidified fluid material forms a pattern of traces on the substrate.
18, A product formed by the method of clause 1.
19. An apparatus comprising: a base configured to fixture a substrate; and a feed head configured to feed a solidified fluid feedstock to the substrate at a deposition site; wherein the base and the feed head are configured to move the deposition site on the substrate.
20. The apparatus of clause 19 wherein the apparatus is configured to move the deposition site by maintaining the substrate in a fixed position and moving the feed head.
21. The apparatus of clause 19 wherein the apparatus is configured to move the deposition site by maintaining the feed head in a fixed position and moving the substrate.
22, The apparatus of clause 19 wherein the apparatus is configured to maintain the feedstock in a solid form in the feed head.

23. The apparatus of clause 22 wherein the feed head comprises a temperature control device configured to maintain the feedstock in a solid form in the feed head.
24. The apparatus of clause 23 wherein the temperature control device comprises a refrigerant control device.
25. The apparatus of clause 22 where the apparatus comprises a chamber configured to maintain the feed head at a temperature at which the feedstock remains in a solid form.
26. The apparatus of clause 19 wherein: the feedstock has a width; and the feed head is configured to reduce the width of the feedstock as it is fed to the substrate.
27. The apparatus of clause 26 wherein the width comprises a diameter.
28. The apparatus of clause 26 wherein the feed head is configured to reduce the width of the feedstock by removing material from the feedstock.
29. The apparatus of clause 28 wherein the feed head comprises one or more blades configured to remove material from the feedstock.
30. The apparatus of clause 29 wherein the one or more blades are configured to rotate around the feedstock as the feedstock is fed to the substrate.
31. The apparatus of clause 28 wherein the feed head is configured to collect the material removed from the feedstock.
32. The apparatus of clause 31 wherein the feed head comprises a catch basin configured to collect the material removed from the feedstock.
33. The apparatus of clause 19 wherein the apparatus is configured to direct a flowable medium to the feedstock as the feedstock is fed to the substrate.
34. The apparatus of clause 33 wherein the apparatus further comprises a nozzle configured to direct the flowable medium to the feedstock.
35. The apparatus of clause 34 wherein the nozzle is configured to direct the flowable medium to the feedstock before the feedstock is deposited on the substrate.
36. The apparatus of clause 34 wherein the nozzle is configured to direct the flowable medium to the feedstock after the feedstock is deposited on the substrate.
37. The apparatus of clause 34 wherein the nozzle is connected to the feed head by an arm.
38. The apparatus of clause 19 wherein the feedstock forms a pattern of traces on the substrate.
39. A product formed by the apparatus of clause 19.
40. A method comprising: feeding a solidified fluid feedstock to a substrate at a deposition site; and moving the deposition site on the substrate.
41. The method of clause 40 further comprising depositing the feedstock on the substrate at e deposition site.
42. The method of clause 41 wherein the feedstock is at least partially ablated at the deposition site.
43. The method of clause 41 wherein the feedstock is at least partially converted to a fluid at the deposition site.
44. The method of clause 41 wherein the feedstock is at least partially melted at the deposition site.
45. The method of clause 40 wherein the feedstock is fed to the substrate by a feed head.
46. The method of clause 45 further comprising maintaining the feedstock in a solid form at the feed head.
47. The method of clause 46 further comprising controlling the temperature of the feedstock at the feed head.
48. The method of clause 47 wherein controlling the temperature of the feedstock comprises controlling a flow of refrigerant to the feed head.
49. The method of clause 40 wherein: the feedstock has a width; and the method further comprises reducing the width of the feedstock as it is fed to the substrate.
50. The method of clause 49 wherein: the width comprises a diameter; and reducing the width of the feedstock comprises reducing the diameter of the feedstock.
51. The method of clause 49 wherein reducing the width of the feedstock comprises removing material from the feedstock.
52. The method of clause 51 wherein material is removed from the feedstock with one or more blades.
53. The method of clause 52 wherein the method comprises rotating the one or more blades around the feedstock as the feedstock is fed to the substrate.
54. The method of clause 51 further comprising collecting material removed from the feedstock.
55. The method of clause 40 further comprising directing a flowable medium to the feedstock.
56. The method of clause 55 further comprising cooling the feedstock with the flowable medium.
57. The method of clause 55 further comprising heating the feedstock with the flowable medium.
58. The method of clause 55 wherein the flowable medium is directed to the feedstock before the feedstock is deposited on the substrate.
59. The method of clause 55 wherein the flowable medium is directed to the feedstock after the feedstock is deposited on the substrate.
60. A product formed by the method of clause 40.
61. A method comprising: feeding a deformable conductive material in a solid form to a deposition site on a substrate; depositing the deformable conductive material on the substrate at the deposition site; and converting at least a portion of the deformable conductive material to a non-solid form.
62. The method of clause 61 further comprising reshaping the deformable conductive material as it is fed to the deposition site.
63. The method of clause 62 wherein reshaping the deformable conductive material comprises narrowing the deformable conductive material at in least one dimension.
64. The method of clause 62 wherein: the deformable conductive material is generally cylindrical shaped; and narrowing the deformable conductive material comprises sharpening the deformable conductive material.
65. The method of clause 61 wherein the deformable conductive material is at least partially ablated at the deposition site.
66. The method of clause 61 further comprising moving the deposition site to form a pattern of the deformable conductive material on the substrate.
67. The method of clause 61 wherein the portion of the deformable conductive material is converted to a non-solid form thermally.
68. The method of clause 67 wherein the portion of the deformable conductive material is converted to a non-solid form by heat from contact pressure.
69. The method of clause 67 wherein the portion of the deformable conductive material is converted to a non-solid form by heat from motion friction.
70. The method of clause 67 wherein the portion of the deformable conductive material is converted to a non-solid form by heat from the substrate.

71. The method of clause 67 wherein the portion of the deformable conductive material is converted to a non-solid form by heat from an external heat source.
72. The method of clause 61 wherein the portion of the deformable conductive material is converted to a non-solid form chemically.
73. The method of clause 61 wherein the portion of the deformable conductive material is converted to a non-solid form by applying a liquifying agent to the deformable conductive material.
74. The method of clause 61 wherein the portion of the deformable conductive material is converted to a non-solid form before being deposited on the substrate.
75. The method of clause 61 wherein the portion of the deformable conductive material is converted to a non-solid form after being deposited on the substrate.
76. The method of clause 61 wherein the portion of the deformable conductive material is converted to a non-solid form at least partially simultaneously with being deposited on the substrate.
77. The method of clause 61 wherein the deformable conductive material is maintained in a solid form thermally.
78. The method of clause 61 wherein the deformable conductive material is maintained in a solid form chemically.
79. The method of clause 61 wherein the deformable conductive material is maintained in a solid form by a solidifying agent.
80. The method of clause 61 wherein the deformable conductive material comprises a liquid at an ambient temperature.
81. The method of clause 61 wherein the deformable conductive material comprises a gel at an ambient temperature.
82. The method of clause 61 wherein the deformable conductive material comprises a non-Newtonian material at an ambient temperature.
83. A product formed by the method of clause 61.

The foregoing description of the present invention(s) have been provided for the purposes of illustration and description. It is not intended to be exhaustive or to limit the invention to the precise forms disclosed. The breadth and scope of the present invention should not be limited by any of the above-described exemplary embodiments. Many modifications and variations will be apparent to the practitioner skilled in the art. The modifications and variations include any relevant combination of the disclosed features. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalents.

The embodiments disclosed herein may be described in the context of various implementation details, but the principles of this disclosure are not limited these or any other specific details. Some functionality has been described as being implemented by certain components, but in other embodiments, the functionality may be distributed between different systems and components in different locations and having various user interfaces. Certain embodiments have been described as having specific components, processes, steps, combinations thereof, and/or the like, but these terms may also encompass embodiments in which a specific process, step, combinations thereof, and/or the like may be implemented with multiple components, processes, steps, combinations thereof, and/or the like, or in which multiple processes, steps, combinations thereof, and/or the like may be integrated into a single process, step, combinations thereof, and/or the like. A reference to a component or element may refer to only a portion of the component or element. The use of terms such as "first" and "second" in this disclosure and the claims may only be for purposes of distinguishing the things they modify and may not indicate any spatial or temporal order unless apparent otherwise from context. A reference to a first thing may not imply the existence of a second thing. Moreover, the various details and embodiments described above may be combined to produce additional embodiments according to the inventive principles of this patent disclosure.

The various details and embodiments described herein may be used in conjunction with any of those described in U.S. Patent Application Publication No. 2018/0247727 published on Aug. 30, 2018 which is incorporated by reference, U.S. Patent Application Publication No. 2019/0056277 published on Feb. 21, 2019 which is incorporated by reference, and U.S. Patent Application Publication No. 2020/0066628 published on Feb. 27, 2020 which is incorporated by reference.

Since the inventive principles of this patent disclosure can be modified in arrangement and detail without departing from the inventive concepts, such changes and modifications are considered to fall within the scope of the following claims.

The invention claimed is:

1. A method comprising:
   obtaining a feedstock of conductive gel in a frozen state;
   depositing the conductive gel onto a substrate by translating the feedstock of frozen conductive gel across the substrate, wherein the depositing forms a pattern of the conductive gel on the substrate; and
   changing the phase of the conductive gel from the frozen state after or during the depositing step.

2. The method of claim 1, wherein obtaining the feedstock of conductive gel in the frozen state comprises:
   providing a mold;
   filling the mold with the feedstock of conductive gel; and
   solidifying the feedstock of conductive gel in the mold.

3. The method of claim 1, wherein, following the change of phase of the conductive gel from the frozen state, the conductive gel comprises:
   a liquid phase component; and
   a solid phase component.

4. The method of claim 3, wherein the solid phase component comprises particles suspended in the liquid phase component.

5. The method of claim 3, wherein the liquid phase component comprises a gallium alloy.

6. The method of claim 5, wherein the solid phase component comprises gallium oxide.

7. The method of claim 6, wherein the gallium oxide comprises gallium oxide particles.

8. The method of claim 6, wherein the gallium oxide comprises a network of gallium oxide structures.

9. The method of claim 8, wherein the network of gallium oxide structures comprises interlinked gallium oxide structures.

10. The method of claim 1, wherein the conductive gel comprises a non-Newtonian material.

11. The method of claim 1, further comprising:
    upon changing the phase of the conductive gel, encapsulating the conductive gel with an encapsulant.

12. The method of claim 11, wherein encapsulating the conductive gel comprises forming the encapsulant into an encapsulant layer.

13. The method of claim 12, wherein forming the encapsulant into the encapsulant layer comprises positioning the conductive gel between the substrate and the encapsulant layer.

14. The method of claim 1, wherein:
the conductive gel is a conducting shear thinning gel composition,
the conductive gel comprises bulk gallium alloy and distributed microstructures formed from the gallium oxide within the bulk gallium alloy, and
the conductive gel comprises interlinked gallium-oxide structure.

15. The method of claim 1, wherein depositing the conductive gel onto the substrate further includes maintaining a contact pressure between the frozen feedstock and the substrate.

16. The method of claim 15, further comprising controlling the pressure or force between the frozen gel and the substate during translation of the feedstock of frozen conductive gel across the substrate.

17. The method of claim 1, wherein obtaining the feedstock of conductive gel in the frozen state comprises forming the feedstock of conductive gel into a rod or a wire.

18. The method of claim 17, further comprising sharpening or modifying the rod or wire to have a tapered end to provide a narrower pattern on the substrate.

19. The method of claim 1, wherein changing the phase of the conductive gel from the frozen state comprises:
liquefying or melting the frozen conductive gel at the deposition site by applying heat or energy from an energy source comprising: infrared energy, ultrasound energy, radio frequency energy, laser energy, or electrical energy.

20. The method of claim 1, wherein depositing the conductive gel onto the substrate comprises advancing the frozen feedstock into contact with the substrate via a movable feed head; and
wherein translating the feedstock of frozen conductive gel across the substrate comprises moving the feed head relative to the substrate.

* * * * *